US012604736B2

(12) United States Patent
Kamgaing et al.

(10) Patent No.: US 12,604,736 B2
(45) Date of Patent: Apr. 14, 2026

(54) SHIELD TO REDUCE SUBSTRATE ELECTROMAGNETIC INTERFERENCE AND WARPAGE

(71) Applicant: Intel Corporation, Santa Clara, CA (US)

(72) Inventors: Telesphor Kamgaing, Chandler, AZ (US); Chu Aun Lim, Hillsboro, OR (US); Eng Huat Goh, Ayer Itam (MY); Min Suet Lim, Gelugor (MY); Kavitha Nagarajan, Bangalore (IN); Jooi Wah Wong, Bukit Mertajam (MY); Chee Kheong Yoon, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 775 days.

(21) Appl. No.: 17/852,816

(22) Filed: Jun. 29, 2022

(65) Prior Publication Data

US 2024/0006336 A1    Jan. 4, 2024

(51) Int. Cl.
| | |
|---|---|
| *H01L 23/552* | (2006.01) |
| *H01L 21/48* | (2006.01) |
| *H01L 23/538* | (2006.01) |
| *H01L 23/00* | (2006.01) |
| *H01L 25/065* | (2023.01) |

(52) U.S. Cl.
CPC ........ *H01L 23/552* (2013.01); *H01L 21/4846* (2013.01); *H01L 23/5386* (2013.01); *H01L 24/16* (2013.01); *H01L 25/0655* (2013.01); *H01L 2224/16225* (2013.01)

(58) Field of Classification Search
CPC .............. H01L 23/552; H01L 23/5386; H01L 21/4846; H01L 24/16; H01L 25/0655; H01L 2224/16225
See application file for complete search history.

(56) References Cited

U.S. PATENT DOCUMENTS

| | | | | |
|---|---|---|---|---|
| 7,629,674 B1 * | 12/2009 | Foster | .................... | H01L 21/56 |
| | | | | 257/659 |
| 2004/0264156 A1 * | 12/2004 | Ajioka | .................. | H01L 23/552 |
| | | | | 257/E25.031 |
| 2010/0110656 A1 * | 5/2010 | Ko | ...................... | H01L 23/3121 |
| | | | | 361/818 |
| 2019/0333865 A1 * | 10/2019 | Choi | ................. | H01L 23/49838 |

* cited by examiner

*Primary Examiner* — Peniel M Gumedzoe

(74) *Attorney, Agent, or Firm* — Schwabe, Williamson & Wyatt, P.C.

(57) ABSTRACT

Embodiments herein relate to systems, apparatuses, techniques, or processes for stiffeners for a surface of a package substrate, where the stiffeners provide EMI/RFI shielding for signal traces or other electrical routings within the package, and in particular for traces at a surface of the package such as microstrip routings. Other embodiments may be described and/or claimed.

24 Claims, 8 Drawing Sheets

A-A'

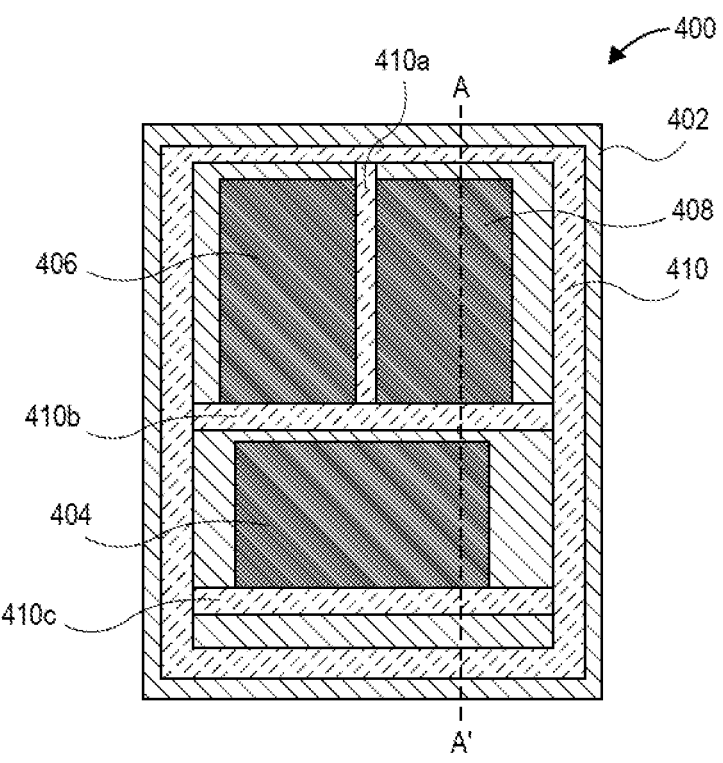
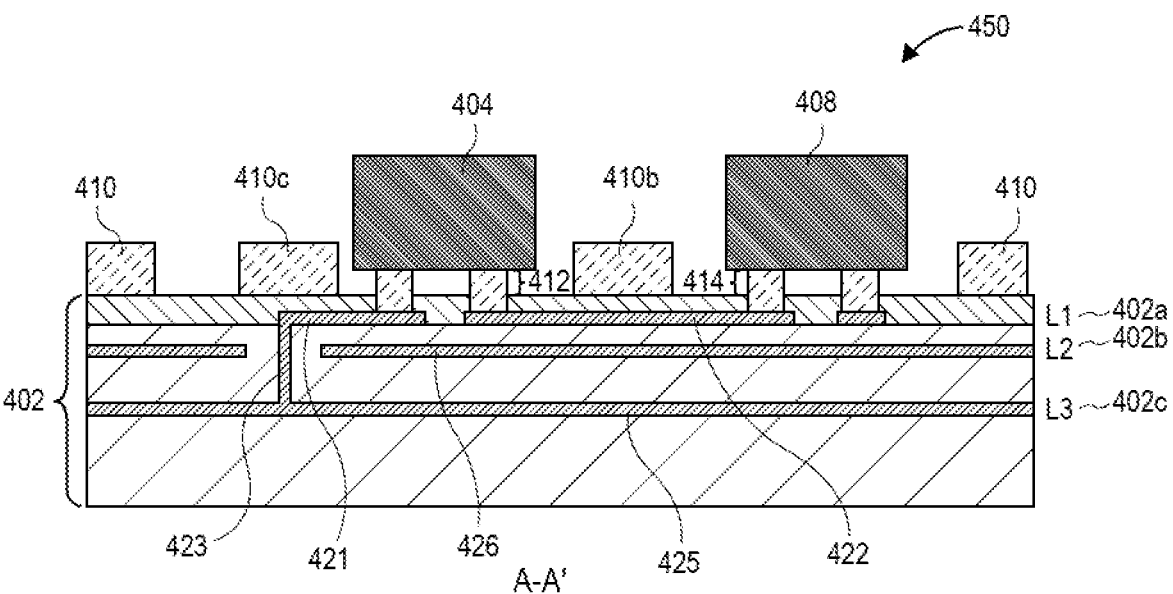
FIG. 4

SIDE VIEW

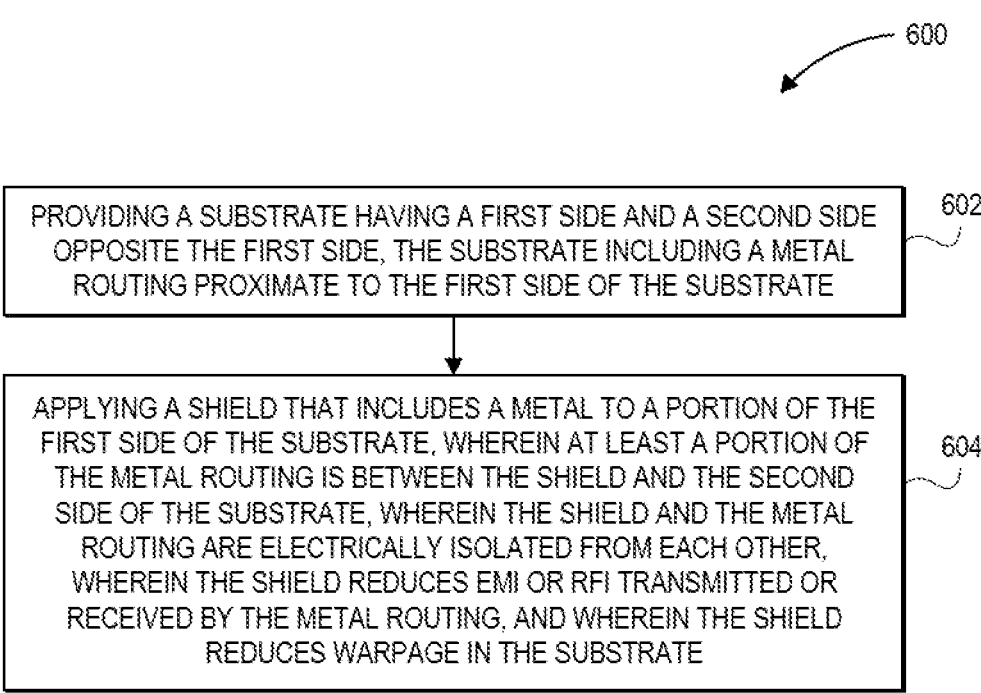

— 600

PROVIDING A SUBSTRATE HAVING A FIRST SIDE AND A SECOND SIDE OPPOSITE THE FIRST SIDE, THE SUBSTRATE INCLUDING A METAL ROUTING PROXIMATE TO THE FIRST SIDE OF THE SUBSTRATE

602

APPLYING A SHIELD THAT INCLUDES A METAL TO A PORTION OF THE FIRST SIDE OF THE SUBSTRATE, WHEREIN AT LEAST A PORTION OF THE METAL ROUTING IS BETWEEN THE SHIELD AND THE SECOND SIDE OF THE SUBSTRATE, WHEREIN THE SHIELD AND THE METAL ROUTING ARE ELECTRICALLY ISOLATED FROM EACH OTHER, WHEREIN THE SHIELD REDUCES EMI OR RFI TRANSMITTED OR RECEIVED BY THE METAL ROUTING, AND WHEREIN THE SHIELD REDUCES WARPAGE IN THE SUBSTRATE

SHIELD TO REDUCE SUBSTRATE ELECTROMAGNETIC INTERFERENCE AND WARPAGE

FIELD

Embodiments of the present disclosure generally relate to the field of package assemblies, and in particular package assemblies that include signal traces on a surface of a package substrate.

BACKGROUND

Continued reduction in end product size of mobile electronic devices such as smart phones and ultrabooks is a driving force for the development of reduced size system in package components. In particular, reducing layer counts of a package substrate may facilitate an overall reduction in Z-height of packages within mobile electronic devices.

BRIEF DESCRIPTION OF THE DRAWINGS

FIG. 4 illustrates a top-down view and a cross section side view of the package that includes a stiffener on the package substrate to reduce EMI and/or RFI for signal traces on the package substrate between a plurality of dies and for signal traces that extend proximate to a surface of the package substrate toward the center of the substrate, in accordance with various embodiments.

FIG. 6 illustrates an example of a process for creating a stiffener on a package substrate, in accordance with various embodiments.

DETAILED DESCRIPTION

Figure 1:
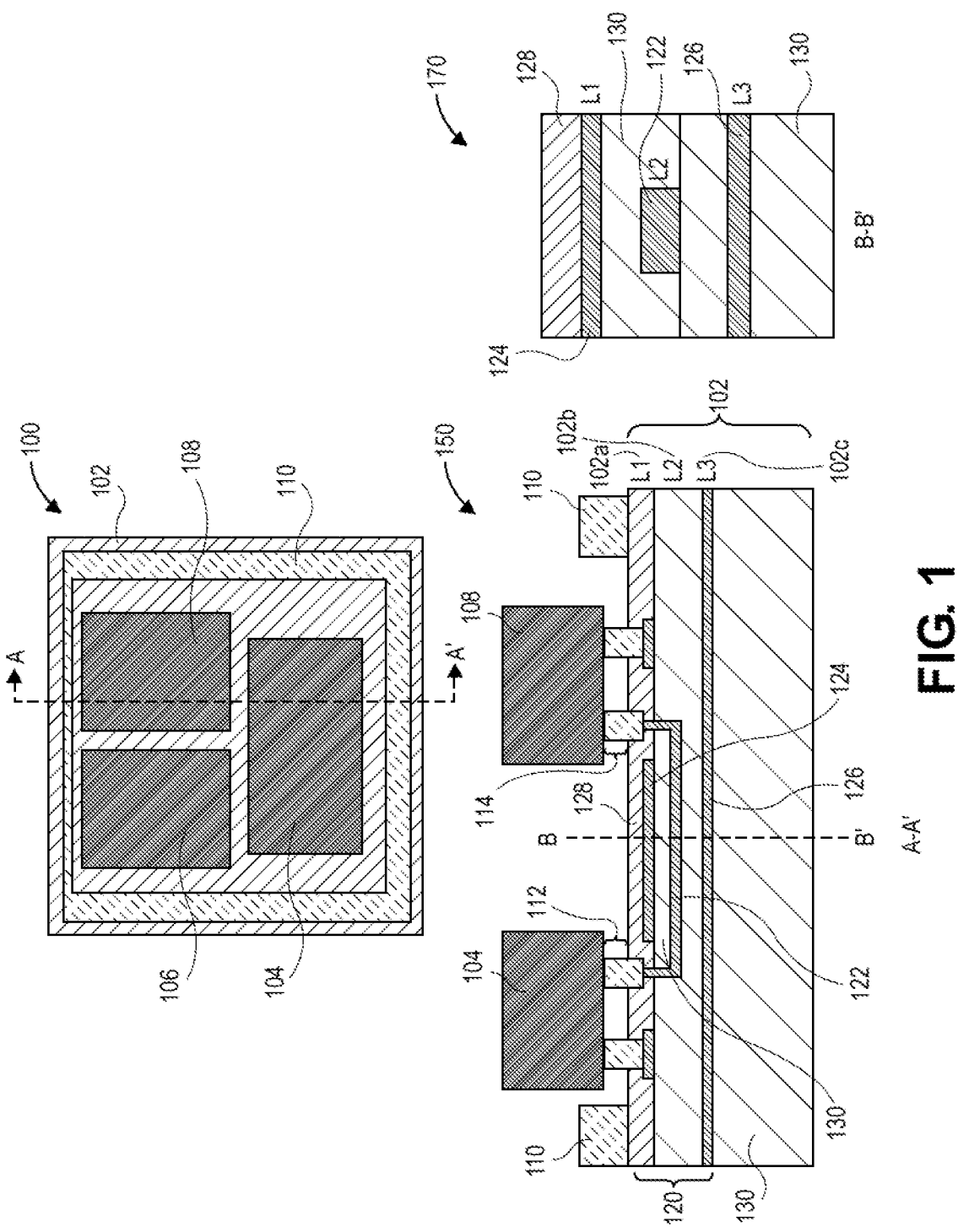
FIG. 1 illustrates a top-down view and two cross section side views of a legacy package that includes strip line routing for high-frequency signals within a substrate of the package.

Embodiments of the present disclosure may generally relate to systems, apparatus, and/or processes directed to shields, which also may be referred to as stiffeners, layers, or protective layers, that may be placed on a surface of a package substrate. In embodiments, the shields provide EMI/RFI shielding for signal traces or other electrical routings within the package, and in particular for traces at a surface of the package proximate to a shield. In embodiments, the shields may provide a stiffening function by reducing warpage of the package substrate, for example due to temperature fluctuations or other mechanical stresses during manufacturing and/or operation of the package.

In embodiments, the signal traces may include microstrip routings, or microstrip transmission lines, that may be used to deliver high-frequency signals between dies or between other structures on the package substrate. In embodiments, high-frequency signals may be referred to as high-speed signals. For example, increasingly high-frequency signals may be routed on traces between, for example but not limited to, high-speed memory dies and a system on chip (SOC) on the substrate, where the trace forms at least a part of a double data rate (DDR) memory link. In other embodiments, routings for high-frequency signals may be a surface of the substrate, and then may form a breakout that turns and extends toward a core of the package substrate. A breakout may be formed, for example, by using one or more electrically conductive vias within the package substrate that couple with the routing at the surface of the substrate. The shield may be placed proximate to where the high-frequency signals are routed at the surface of the package substrate, as well as proximate to a region of the breakout on the package substrate.

In embodiments, the shield may surround or partially surround one or more dies, or one or more packages or other devices that may be on a surface of the package substrate. In embodiments, the shield may be placed for warpage control or for mechanical stability of the package substrate. In embodiments, the shield may also be placed for EMI/RFI reduction. In embodiments, the shielding may reduce EMI/RFI received by the signal traces from outside the package that may affect the quality of the signals transmitted along the signal traces. In embodiments, the shielding may reduce EMI/RFI that is transmitted by the signal traces, for example by high-frequency signals, to other devices and/or components that may be outside of the package, or may be elsewhere on the package. Examples of these other devices may be an antenna on the package, or unshielded signal lines carrying radio frequency signals (WiFi, Bluetooth, 4G) signals operating in the same frequency band as high-speed memory channels. Other examples may include switching noise or harmonics from on-package power delivery networks.

In legacy implementations, communication and computing platforms increasingly require high-speed communication channels between different dies, such as a computing die and a memory die, or an input (I/O) hub and a compute, graphics, or memory die. Often, these dies may be on the same package, or on different packages, that use increasing data transmission speeds. In legacy implementations, microstrip implementations may be formed on the surface of the package to facilitate this high-speed communication between dies.

However, with increasing data transmission speeds, these legacy microstrip implementations may no longer meet signal integrity requirements. Furthermore, signals on these legacy microstrip implementations may interfere with Wi-Fi and/or other wireless frequencies on or near the package. To meet signal integrity requirements, legacy implementations of these packages may turn to strip line transmission lines on or within the package substrate. However, this may result in increased substrate layers, for example three package layers for routing that result in thicker packages that increase the overall Z-height of the package. In addition, these legacy implementations result in more expensive packages, as well as longer lead times required for package fabrication.

In embodiments, the shield may be placed on one or more sides of the package substrate as a compartmental stiffener that may also serve as an EMI/RFI shield or a ground reference for signal traces on the surface of the package substrate. In embodiments, the stiffening function improves warpage mitigation for both thin and large packages. In embodiments, signal integrity performance is improved by reducing cross talk and extending the frequency range for the traces. In addition, EMI/RFI immunity may be provided through shielding from external signal interference. In addition, coreless and thin core package substrates may be used, for example as used in thin and light laptops and other portable electronic devices such as wearables and smart phones, where the shield may stiffen the package substrate and not increase the overall Z-height of the package.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates a top-down view, and two cross section side views of a legacy package that includes strip line routing for high-frequency signals within a substrate of the package. Diagram 100 shows a top-down view of a legacy package that includes a substrate 102, and a first die 104, a second die 106, and a third die 108 that are coupled with the substrate 102. A legacy stiffener 110 is also coupled with the substrate 102. In implementations, the legacy stiffener 110 may include materials such as metals, steel, ceramic, or reinforced plastic that may provide rigidity to the substrate 102 when it is subjected to mechanical and/or thermal stress. In implementations, the legacy stiffener 110 may have a varying thickness as measured from the surface of the substrate 102. In implementations, the legacy stiffener 110 may also have a varying width across a portion of the substrate 102, depending upon the geometry of the legacy substrate 102.

Diagram 150 shows a cross section side view of the legacy package at A-A' of diagram 100 that shows the first die 104 and third die 108 that are coupled with the substrate 102. In implementations, a first connector 112 may couple the first die 104 with the substrate 102, and a second connector 114 may couple the third die 108 with the substrate 102. In implementations, the first connector 112 or the second connector 114 may be a ball grid array (BGA). A strip line routing 120 may be used within the package 102 to provide routing for high-frequency signals between the first die 104 and the third die 108.

In implementations, the strip line routing may include a trace 122 that may electrically couple the first connector 112 with the second connector 114. A first plane 124 and a second plane 126 may be above and below, respectively, the trace 122. In embodiments, the first plane 124 and the second plane 126 may be electrically conductive metal planes or metal layers, and may be ground planes or power planes. In legacy implementations, three layers of the strip line routing 120 are needed, with the first plane 124 in the first layer L1 102a, the trace 122 within a second layer L2 102b, and the second plane 126 within the third layer L3. In implementations, a solder resist 128 may be above the first plane 124. In embodiments, a dielectric material 130 may separate the various layers 102a, 102b, and 102c of the substrate 102. Diagram 170 shows a cross section side view B-B' of diagram 150.

Figure 2:
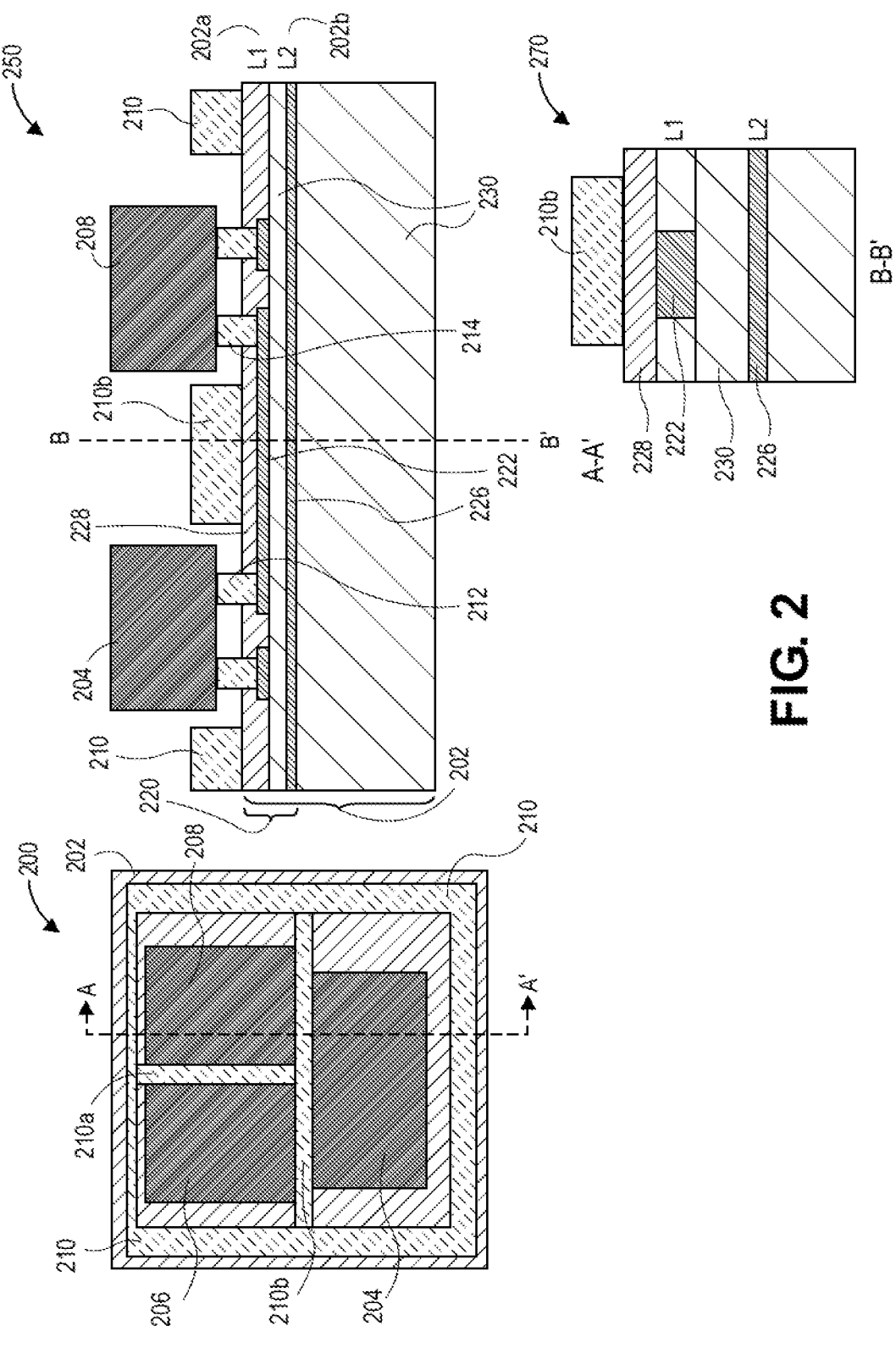
FIG. 2 illustrates a top-down view and three cross section side views of a package that includes a stiffener on the package substrate to reduce warpage of the package substrate and to reduce electromagnetic interference (EMI) and/or radio frequency interference (RFI) for signal traces on the package substrate that are proximate to a surface of the package substrate that connect dies on the substrate, in accordance with various embodiments.
Figure 2:
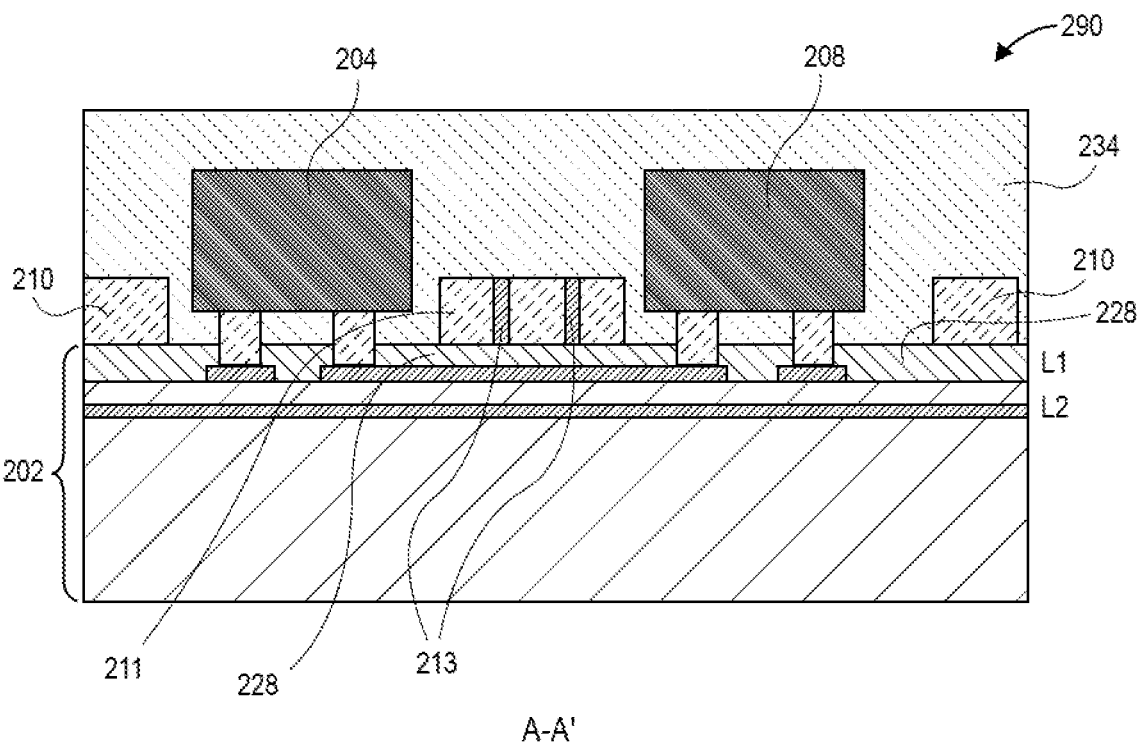

FIG. 2 illustrates a top-down view, and two cross section side views of a package that includes a stiffener on the package substrate to reduce warpage of the package substrate and to reduce EMI and/or RFI for signal traces on the package substrate that are proximate to a surface of the package substrate that connect dies on the substrate, in accordance with various embodiments. Diagram 200 shows a top-down view of a package that includes a substrate 202, and a first die 204, a second die 206, and a third die 208 that are coupled with the substrate 202, which may be similar to substrate 102, first die 104, second die 106, and third die 108 of FIG. 1.

A stiffener 210 is coupled with the substrate 202 and may redirect the EMI/RFI to ground when the stiffener 210 is electrically coupled to ground, such as electrically active plane 226 discussed below. In embodiments, the stiffener 210 may also include ceramic or reinforced plastic, may be electrically conductive and may include electrically conductive elements such as metals including steel. In embodiments, the stiffener 210 may include materials to absorb and/or block EMI/RFI. In embodiments the stiffener 210 may have a varying thickness as measured from the surface of the substrate 202. In embodiments, the stiffener 210 may be electrically connected to ground using a solder paste, conductive epoxy, adhesive, metal to metal bonding, conductive clamps at an edge of the substrate 202, or wire bonding.

In embodiments, the stiffener 210 may also have a varying width, depending upon the design of the substrate 202. In embodiments, the stiffener 210 may include other stiffener components 210a, 210b that may be placed in other areas of the surface of the substrate 202. For example, the stiffener component 210a may be placed between the second die 206 and the third die 208, and the stiffener component 210b may be placed between the first die 204 and the third die 208. The placement of the stiffener 210, as well as placement of the stiffener components 210a, 210b, facilitate planarity of the substrate 202 during manufacturing or operation, as well as to provide EMI/RFI shielding to various portions of the substrate 202 as discussed further below.

Although the stiffener 210 is shown in a rectangular shape and stiffener components 210a, 210b shown as segments within the stiffener 210 and connecting to the sides of the stiffener 210, in embodiments the stiffener 210, and components 210a, 210b may be of any size, may be connected or not connected to each other, and may be in any position on the substrate 202.

Diagram 250 shows a cross section side view of the package at A-A' of diagram 200 that shows the first die 204 and third die 208 that are coupled with the substrate 202. In embodiments, a first connector 212 may couple the first die with the substrate 202, and a second connector 214 may couple the third die 208 with the substrate 202. The first connector 212 and the second connector 214 may be similar to first connector 112 and second connector 114 of FIG. 1. A microstrip 220 may be used within the package 202 to provide routing for high-frequency signals between the first die 204 and the third die 208.

In embodiments, the microstrip 220 may include a trace 222 that may electrically couple the first connector 212 with the second connector 214. An electrically conductive plane 226 may be below the trace 222. In embodiments, the electrically conductive plane 226 may be a ground plane or a power plane. A stiffener component 210b, which is part of stiffener 210, may be above and proximate to the trace 222. In embodiments, the stiffener component 210b may overlap the trace 222 by varying amounts depending upon, for example, a range of frequencies of the signal that may be carried on the trace 222. In embodiments, the ends of the stiffener component 210b may be as close as possible to first die 204 and third die 208 to avoid impedance discontinuity and stray radiation.

In other embodiments, the stiffener 210 may be a solid metal or a mesh. In embodiments, dimensions of the openings in the mesh may be defined by a maximum frequency at which EMI/RFI is to be mitigated. In embodiments, a thickness or a width of all or part of the stiffener 210, including the stiffener component 210b, may be varied based upon anticipated operational conditions and/or operational environment of the package.

In this embodiment, two layers L1 202a and L2 202b may be used to implement the microstrip 220. In other embodiments, if the stiffener component 210b is electrically conductive and is coupled with a ground, layer L2 202b may not be needed, and microstrip 220 may be implemented using only layer L1 202a, with the stiffener component 210b at least partially overlapping the trace 222. In these embodiments, layer L2 202b may be freed up to route power or to route other signals (not shown) within the substrate 202.

In embodiments, a solder resist 228, which may be similar to solder resist 128 of FIG. 1, may be disposed between the stiffener component 210b and the trace 222. In embodiments, a dielectric 230 may be between the first layer L1 202a and the second layer L2 202b. In embodiments, there may be multiple microstrip transmission lines (not shown) throughout the package substrate 202, in addition to the microstrip 220. Diagram 270 shows a cross section side view B-B' of diagram 250.

In FIG. 2 (cont.), diagram 290, which may be similar to diagram 250, shows a mold 234 that is placed on top of the substrate 202, underneath the first die 204 and the third die 208, on the solder resist layer 228, and around the stiffener 210. The mold 234 may be applied using legacy techniques. In embodiments, the stiffener component 211, which may be similar to stiffener component 210b of diagram 250, may include openings 213 within the stiffener component 211 that extend through to the solder resist layer 228. In embodiments, the mold 234 during application may penetrate these openings 213 and secure to the solder resist layer 228. As a result, the additional mold 234 connecting with the substrate will further reduce a risk of delamination of the stiffener component 211 from the substrate 202 during operation and manufacturing. If the mold 234 does not adhere to the solder resist layer 228, then delamination may occur during testing or operation. In embodiments, openings 213 that serve as adhesion holes in the stiffener component 211, or in other embodiments using a stiffener 210 that is a mesh, may be used to facilitate the adhesion of the stiffener component 211 to the substrate 202.

Figure 3:
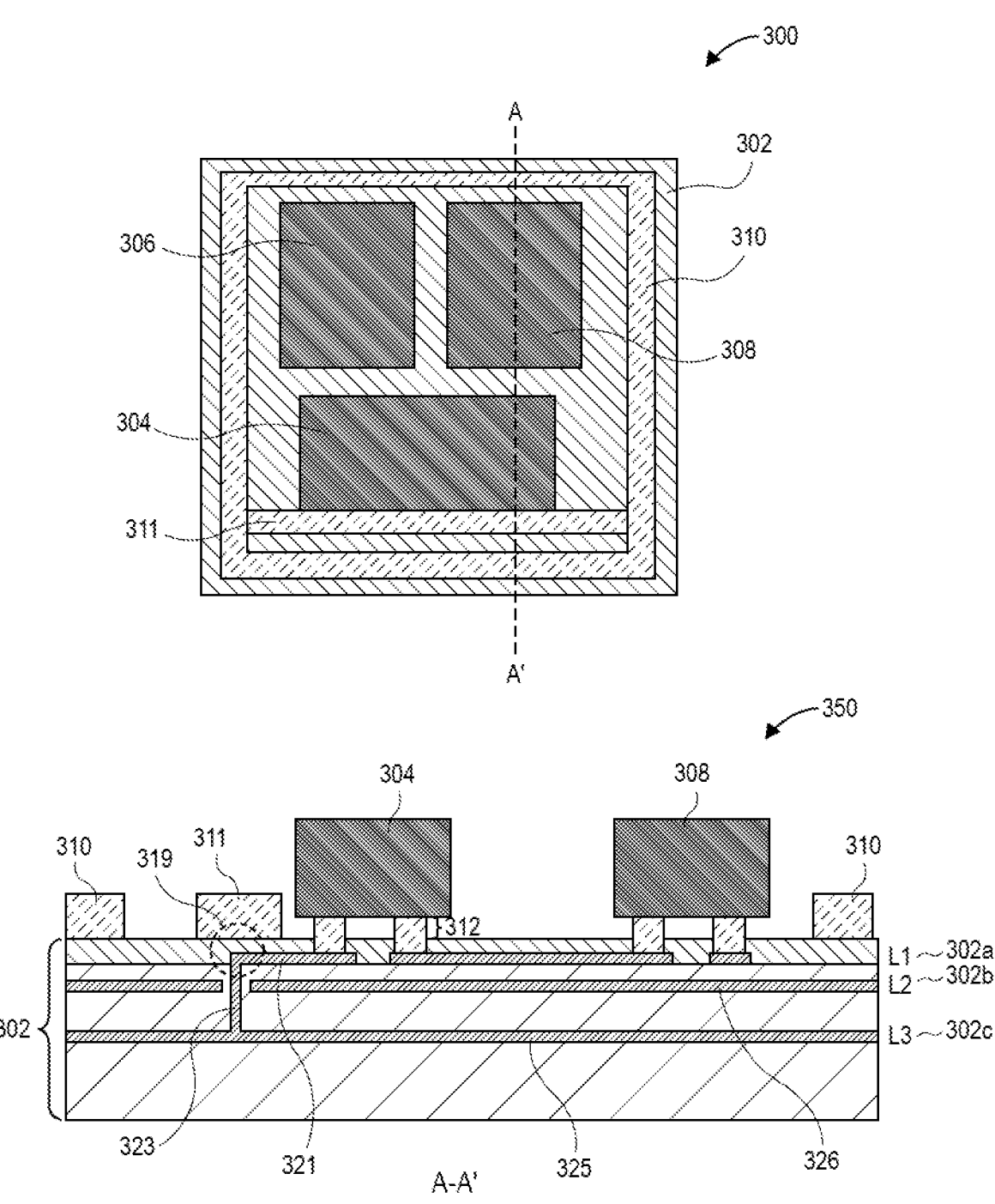
FIG. 3 illustrates a top-down view and a cross section side view of a package that includes a stiffener on the package substrate to reduce EMI and/or RFI for signal traces on the package substrate that extend proximate to a surface of the package substrate toward the center of the substrate, in accordance with various embodiments.

FIG. 3 illustrates a top-down view and a cross section side view of a package that includes a stiffener on the package substrate to reduce EMI and/or RFI for signal traces on the package substrate that extend proximate to a surface of the package substrate toward the center of the substrate, in accordance with various embodiments. Diagram 300 shows a top-down view of a package that includes a substrate 302, and a first die 304, a second die 306, and a third die 308 that are coupled with the substrate 302, which may be similar to substrate 202, first die 204, second die 206, and third die 208 of FIG. 2.

A stiffener 310, which may be similar to stiffener 210 of FIG. 2, is also coupled with the substrate 302. The stiffener 310 may be electrically conductive and in embodiments may serve as a ground reference plane. In embodiments, the stiffener 310 may also include a ceramic or ceramic materials. In embodiments, the stiffener 310 may have a varying thickness as measured from the surface of the substrate 302, and may also have a varying width. The stiffener 310 may serve to facilitate planarity of the substrate 302 during manufacturing or operation, as well as to provide EMI/RFI shielding to various portions of the substrate 302. In embodiments, a stiffener component 311, which may be similar to stiffener components 210a, 210b of FIG. 2, may be placed on the substrate 302 and may be electrically coupled with the stiffener 310.

Diagram 350 shows a cross section side view of the package at A-A' of diagram 300 that shows the first die 304 and third die 308 that are coupled with the substrate 302. In embodiments, a connector 312 may couple the first die 304 with the substrate 302. The connector 312 may be similar to first connector 212 of FIG. 2. A microstrip 321, which may be similar to trace 222 of FIG. 2 may be used within the substrate 302 to provide routing for high-frequency signals to and from the first die 304 via the connector 312. In embodiments, the microstrip 321 may be a trace for routing high-frequency signals. The microstrip 321 may be in a L1 layer 302a of the substrate 302. A first metal routing 326, which may be similar to plane 226 of FIG. 2, may be in a L2 layer 302b of the substrate 302.

In embodiments, the vertical electrical path 323 may electrically couple the microstrip 321 with a second metal routing 325 that may be in L3 layer 302c of substrate 302. In embodiments, the vertical electrical path 323 may be used to route high-frequency signals within the interior of the substrate 302. In embodiments, the vertical electrical path 323 is not directly electrically coupled with the first metal routing 326. In embodiments, the vertical electrical path 323 may include one or more vias that are plated or filled with copper. In embodiments, the region 319 which shows the connection between the microstrip 321 and the vertical electrical path 323 may be referred to as a breakout region 319.

In embodiments, the stiffener component 311 may be placed proximate to the breakout region 319, and over at least a portion of the microstrip 321 to provide EMI/RFI shielding to the microstrip 321 and the breakout region 319. In embodiments, shielding may not be required over the second metal routing 325 due to the depth of the second metal routing 325 within L3 layer 302c receiving sufficient EMI/RFI shielding from the L1 layer 302a and L2 layer 302b layers of the substrate 302. It should be understood that other layers within substrate 302 are not shown for clarity that may be used to provide additional shielding.

FIG. 4 illustrates a top-down view and a cross section side view of the package that includes a stiffener on the package substrate to reduce EMI and/or RFI for signal traces on the package substrate between a plurality of dies and for signal traces that extend proximate to a surface of the package substrate toward the center of the substrate, in accordance with various embodiments. Diagram 400 shows a top-down view of a package that includes a substrate 402 and a first die 404, a second die 406, and a third die 408 that are coupled with the substrate 402. These may be similar to substrate 202, first die 204, second die 206, and third die 208 of FIG. 2.

A stiffener 410 is also coupled with the substrate 402. In implementations, the stiffener 410 may be similar to stiffener 210 of FIG. 2. Stiffener 410 may be electrically conductive. In embodiments, the stiffener 410 may also include a ceramic or ceramic materials. In embodiments, the stiffener 410 may have a varying thickness as measured from the surface of the substrate 410, as well as a varying width.

In embodiments, the stiffener 410 may include other stiffener components 410a, 410b, 410c that may be placed in other areas of the surface of the substrate 402. The stiffener components 410a, 410b may be similar to stiffener components 210a, 210b of FIG. 2 and stiffener component 410c may be similar to stiffener component 311 of FIG. 3. The placement of the stiffener 410, as well as placement of the stiffener components 410a, 410b, 410c facilitate planarity of the substrate 402 during manufacturing or operation, as well as to provide EMI/RFI shielding to various portions of the substrate 402 as discussed further below.

Diagram 450 shows a cross section side view of the package at A-A' of diagram 400 that shows the first die 404 and third die 408 that are coupled with the substrate 402. In embodiments, a first connector 412 may couple the first die 404 with the substrate 402 and a second connector 414 may couple the third die 408 with substrate 402. A first microstrip 421, which may be similar to microstrip 321 of FIG. 3 may be in a L1 layer 402a and may electrically couple with the first die 404 through the first connector 412. A second microstrip 422, which may be similar to microstrip 220 of FIG. 2, may also be within L1 layer 402a and provide a high-speed electrical coupling between the first connector 412 and the second connector 414.

Similar to diagram 350 of FIG. 3, a vertical electrical path 423 may electrically couple the first microstrip 421 with a second metal routing 425 that may be in L3 layer 402c of substrate 402. In embodiments, the vertical electrical path 423 may not be directly electrically coupled with a first metal routing 426 in L2 layer 402b. In embodiments, the vertical electrical path 423 may include one or more vias that are plated or filled with copper. In embodiments, the stiffener component 410c may be placed above the vertical electrical path 423 and proximate to the first microstrip 421 to provide EMI/RFI protection. The stiffener component 410c may be in an area similar to the breakout region 319 of FIG. 3.

Similar to diagram 250 of FIG. 2, the second microstrip 422 may electrically couple the first connector 412 with the second connector 414. A stiffener component 410b may be placed above a portion of the second microstrip 422 to provide EMI shielding. In embodiments, the stiffener component 410b may be grounded to provide a ground plane to facilitate high-speed communications along the second microstrip 422.

In the embodiments described with respect to FIG. 4, it should be appreciated that there are a number of different configurations of microstrips 422, 421 that may be shielded from EMI/RFI, and have their data speeds increased by grounding various stiffener components 410b, 410c. In addition, a mold, such as the mold 234 described with respect to FIG. 2, may encase a portion or all of the package is shown with respect to diagram 450.

Figure 5B:
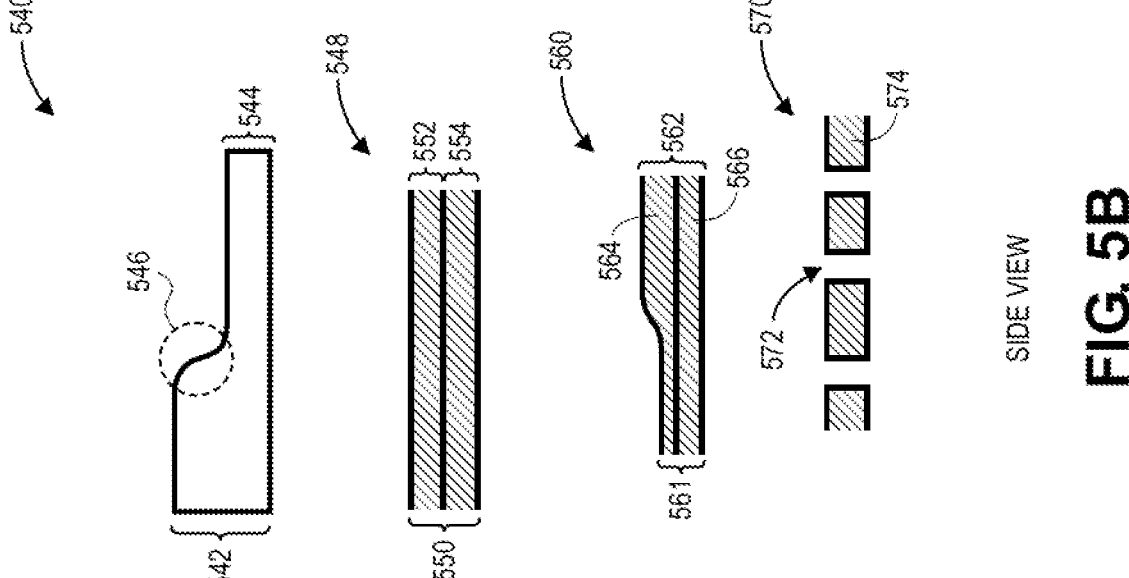
FIGS. 5A-5B illustrate top-down views and cross section side views of stiffeners, in accordance with various embodiments.
Figure 5A:
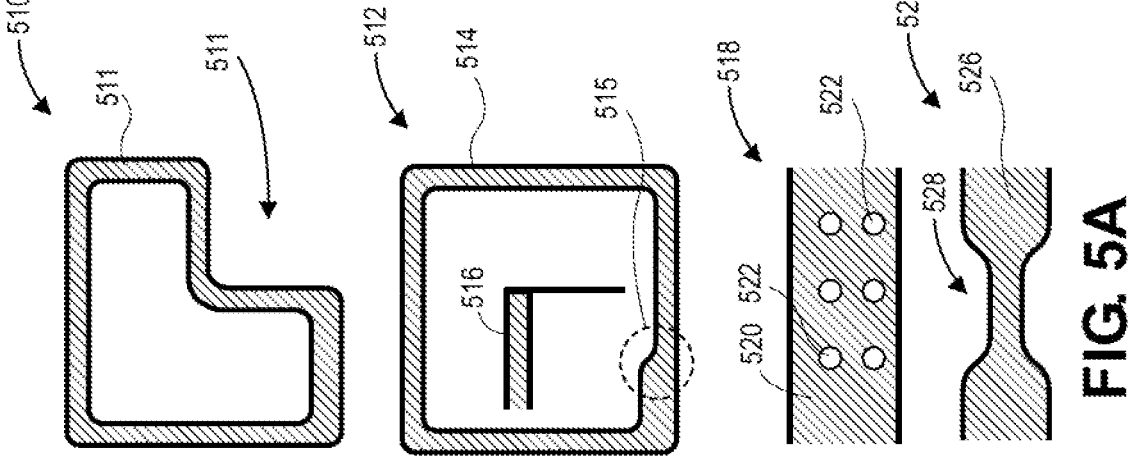

FIGS. 5A-5B illustrate top-down views and cross section side views of stiffeners, in accordance with various embodiments. FIG. 5A shows various top-down views of stiffeners in nonlimiting examples of various embodiments. Diagram 510 shows an example of a substantially rectangular stiffener 511, with one corner excluded from the stiffener 511. Diagram 512 shows a substantially rectangular stiffener 514, with a width transition area 515. In addition, additional stiffeners 516, may not be directly coupled with the stiffener 514.

Diagram 518 shows a stiffener 520 with a plurality of openings 522 that extend through the stiffener. In embodiments, these openings 522 may be designed for thermal conductivity properties, or may be used for a mold, such as mold 234 of FIG. 2, to penetrate and to reach a surface of the substrate, in order to reduce the possibility of delamination of the stiffener 520 from the substrate. In embodiments, the plurality of openings 522 may also be filled with the solder or conductive epoxy to ground the stiffener 520 with a package ground. Diagram 524 shows a stiffener 526, that has a section 528 that has a narrower width, for example for providing electrical continuity throughout the stiffener 526, where no EMI/RFI shielding is required proximate to the section 528.

FIG. 5B shows cross section side views of various stiffeners. Diagram 540 shows a across section side view of the stiffener with a first height 542, which thins over a region 546 to a second height 544. Diagram 548 shows an example of the stiffener 550 that has two layers, a first layer 552 that is on top of a second layer 554. In embodiments, the first layer 552 and the second layer 554 may have different material properties that may be chosen based upon warpage conditions of the substrate to which they may be attached.

Diagram 560 shows a stiffener that has a first layer 564 that is on a second layer 566, where the width of the first layer 564 changes to change the overall height of the stiffener from a first height 561 to a second height 562. Diagram 570 shows an example of a stiffener 574, which may be similar to stiffener 520, that has holes 572, which may be similar to holes 522.

FIG. 6 illustrates an example of a process for creating a stiffener on a package substrate, in accordance with various embodiments.

At block 602, the process may include providing a substrate having a first side and a second side opposite the first side, the substrate including a metal routing proximate to the first side of the substrate. In embodiments, the substrate may be similar to substrate 202 of FIG. 2, substrate 302 of FIG. 3, or substrate 402 of FIG. 4. In embodiments, the metal routing may be similar to microstrip 220 or trace 222 of FIG. 2, microstrip 321 of FIG. 3, or microstrips 421, 422 of FIG. 4.

At block 604, the process may further include applying a shield that includes a metal to a portion of the first side of the substrate, wherein at least a portion of the metal routing is between the shield and the second side of the substrate, wherein the shield and the metal routing are electrically isolated from each other, wherein the shield reduces EMI or RFI transmitted or received by the metal routing, and wherein the shield reduces warpage in the substrate. In embodiments, the shield may be similar to stiffeners 210, 210a, 210b of FIG. 2, stiffeners 310, 311 of FIG. 3, stiffeners 410, 410a, 410b, 410c of FIG. 4, or stiffeners as shown in 510, 512, 518, 524, 540, 548, 560, 570 of FIGS. 5A-5B.

Figure 7:
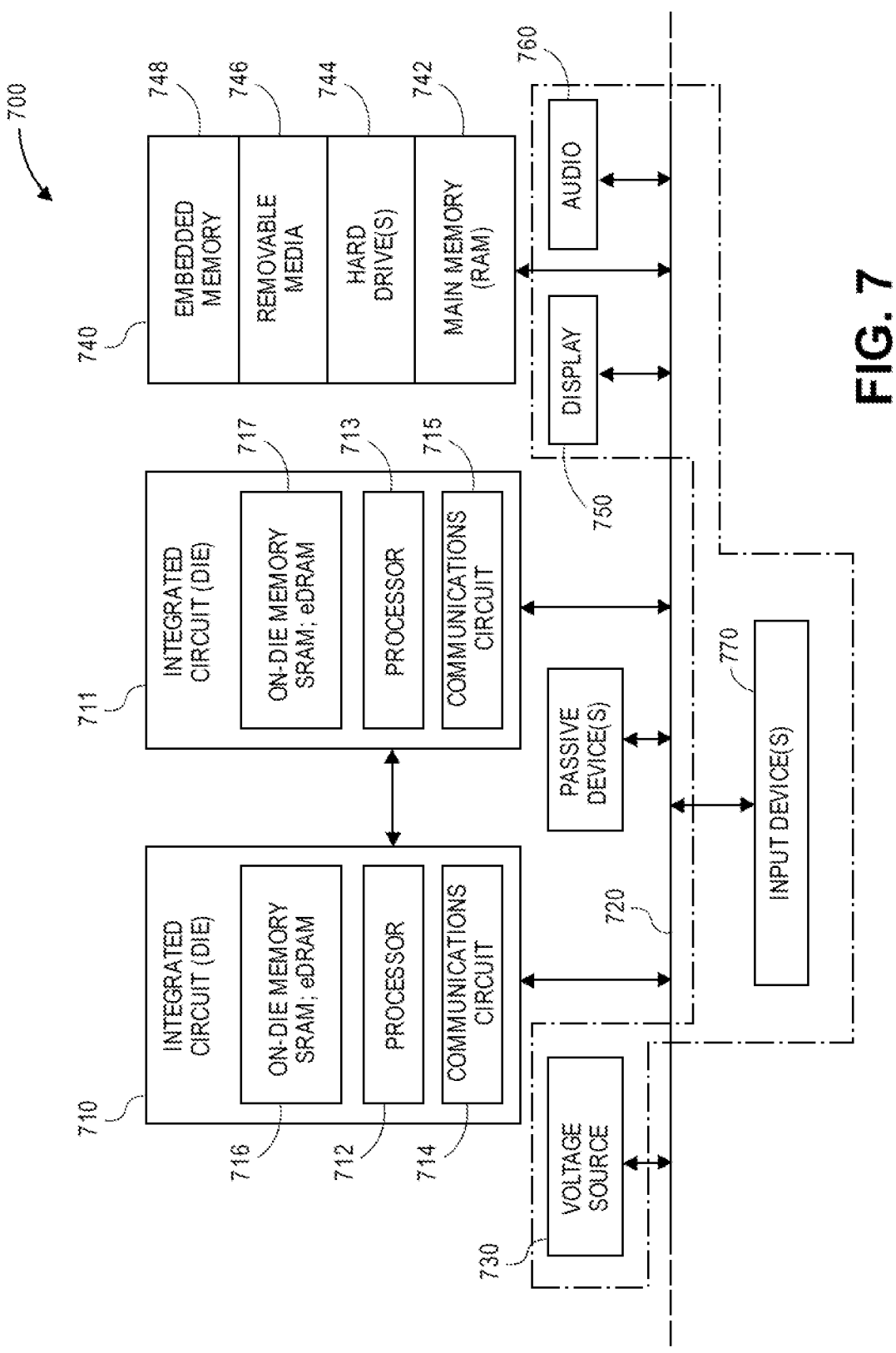
FIG. 7 schematically illustrates a computing device, in accordance with various embodiments.

FIG. 7 is a schematic of a computer system 700, in accordance with an embodiment of the present invention. The computer system 700 (also referred to as the electronic system 700) as depicted can embody a shield to reduce substrate electromagnetic interference and warpage, according to any of the several disclosed embodiments and their equivalents as set forth in this disclosure. The computer system 700 may be a mobile device such as a netbook computer. The computer system 700 may be a mobile device such as a wireless smart phone. The computer system 700 may be a desktop computer. The computer system 700 may be a hand-held reader. The computer system 700 may be a server system. The computer system 700 may be a supercomputer or high-performance computing system.

In an embodiment, the electronic system 700 is a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

The integrated circuit 710 is electrically coupled to the system bus 720 and includes any circuit, or combination of circuits according to an embodiment. In an embodiment, the integrated circuit 710 includes a processor 712 that can be of any type. As used herein, the processor 712 may mean any type of circuit such as, but not limited to, a microprocessor, a microcontroller, a graphics processor, a digital signal processor, or another processor. In an embodiment, the processor 712 includes, or is coupled with, a shield to reduce substrate electromagnetic interference and warpage, as disclosed herein. In an embodiment, SRAM embodiments are found in memory caches of the processor. Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems, or a communications circuit for servers. In an embodiment, the integrated circuit 710 includes on-die memory 716 such as static random-access memory (SRAM). In an embodiment, the integrated circuit 710 includes embedded on-die memory 716 such as embedded dynamic random-access memory (eDRAM).

In an embodiment, the integrated circuit 710 is complemented with a subsequent integrated circuit 711. Useful embodiments include a dual processor 713 and a dual communications circuit 715 and dual on-die memory 717 such as SRAM. In an embodiment, the dual integrated circuit 710 includes embedded on-die memory 717 such as eDRAM.

In an embodiment, the electronic system 700 also includes an external memory 740 that in turn may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory drives, and other removable media known in the art. The external memory 740 may also be embedded memory 748 such as the first die in a die stack, according to an embodiment.

In an embodiment, the electronic system 700 also includes a display device 750, an audio output 760. In an embodiment, the electronic system 700 includes an input device such as a controller 770 that may be a keyboard, mouse, trackball, game controller, microphone, voice-recognition device, or any other input device that inputs information into the electronic system 700. In an embodiment, an input device 770 is a camera. In an embodiment, an input device 770 is a digital sound recorder. In an embodiment, an input device 770 is a camera and a digital sound recorder.

As shown herein, the integrated circuit 710 can be implemented in a number of different embodiments, including a package substrate having a shield to reduce substrate electromagnetic interference and warpage, according to any of the several disclosed embodiments and their equivalents, an electronic system, a computer system, one or more methods of fabricating an integrated circuit, and one or more methods of fabricating an electronic assembly that includes a package substrate having a shield to reduce substrate electromagnetic interference and warpage, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a shield to reduce substrate electromagnetic interference and warpage embodiments and their equivalents. A foundation substrate may be included, as represented by the dashed line of FIG. 7. Passive devices may also be included, as is also depicted in FIG. 7.

EXAMPLES

The following paragraphs describe examples of various embodiments.

Example 1 is an apparatus comprising: a substrate with a first side and a second side opposite the first side; an electrically conductive trace proximate to the first side of the substrate; and a shield on the surface of the substrate, wherein at least a portion of the conductive trace is between the shield and the second side of the substrate, and wherein the shield reduces electromagnetic interference (EMI) or radio frequency interference (RFI) transmitted or received by the conductive trace.

Example 2 includes the apparatus of example 1, or of any other example or embodiment herein, wherein the shield is secured to the first side of the substrate, wherein the shield reduces warpage of the substrate.

Example 3 includes the apparatus of example 1, or of any other example or embodiment herein, wherein the shield includes an electrically conductive material, and wherein the shield is electrically coupled to a ground reference within the substrate.

Example 4 includes the apparatus of example 3, or of any other example or embodiment herein, wherein the shield includes a selected one or more of: steel, copper, aluminum, ceramic, or plastic.

Example 5 includes the apparatus of example 3, or of any other example or embodiment herein, wherein the electrically conductive trace is a part of a microstrip transmission line.

Example 6 includes the apparatus of example 1, or of any other example or embodiment herein, wherein the electrically conductive trace is at a top layer of the substrate.

Example 7 includes the apparatus of example 1, or of any other example or embodiment herein, wherein the shield includes a ceramic.

Example 8 includes the apparatus of example 1, or of any other example or embodiment herein, wherein the shield and the electrically conductive trace are electrically isolated from each other.

Example 9 includes the apparatus of example 1, or of any other example or embodiment herein, wherein the electrically conductive trace includes a plurality of electrically conductive traces.

Example 10 includes the apparatus of example 1, or of any other example or embodiment herein, further comprising: one or more electrically conductive vias electrically coupled with the electrically conductive trace, wherein the one or more electrically conductive vias extend from the electrically conductive trace toward the second side of the substrate; and wherein the one or more electrically conductive vias are between a portion of the shield and the second side of the substrate.

Example 11 is a package comprising: a substrate with a first side and a second side opposite the first side; a first die on the first side of the substrate and a second die on the second side of the substrate; an electrically conductive routing proximate to the first side of the substrate, wherein the electrically conductive routing electrically couples the first die with the second die; and a layer on the first side of the substrate, wherein a portion of the layer is between the first die and the second die, and wherein a portion of the electrically conductive routing is between the portion of the layer and the second side of the substrate, and wherein the layer reduces electromagnetic interference (EMI) or radio frequency interference (RFI) transmitted or received by the electrically conductive routing.

Example 12 includes the package of example 11, or of any other example or embodiment herein, wherein the electrically conductive routing is a first electrically conductive routing, and wherein the portion of the layer is a first portion of the layer; and further comprising: a third die on the first side of the substrate; a second electrically conductive routing proximate to the first side of the substrate, the second electrically conductive routing electrically coupling the first die with the third die; and wherein a second portion of the layer is between the first die and the third die, and wherein a portion of the second electrically conductive routing is between the second portion of the layer and the second side of the substrate.

Example 13 includes the package of example 12, or of any other example or embodiment herein, wherein the first electrically conductive routing includes a plurality of first electrically conductive routings; and wherein the second electrically conductive routing includes a plurality of second electrically conductive routings.

Example 14 includes the package of example 12, or of any other example or embodiment herein, wherein the first electrically conductive routing and the second electrically conductive routing are at a top layer of the substrate.

Example 15 includes the package of example 11, or of any other example or embodiment herein, wherein the electrical routing includes a microstrip transmission line.

Example 16 includes the package of example 11, or of any other example or embodiment herein, wherein the layer includes a metal.

Example 17 includes the package of example 16, or of any other example or embodiment herein, wherein the layer is electrically conductive.

Example 18 includes the package of example 17, or of any other example or embodiment herein, wherein the layer is coupled with a ground of the substrate.

Example 19 includes the package of example 11, or of any other example or embodiment herein, wherein the layer is secured to the first side of the substrate with an adhesive.

Example 20 includes the package of example 11, or of any other example or embodiment herein, wherein the substrate is a coreless substrate.

Example 21 includes a package of example 11, or of any other example or embodiment herein, wherein the substrate has a core with a thickness that is less than 200 μm.

Example 22 includes the package of example 11, or of any other example or embodiment herein, wherein the electrical routing is a plurality of electrical routings.

Example 23 is a method comprising: providing a substrate having a first side and a second side opposite the first side, the substrate including a metal routing proximate to the first side of the substrate; and applying a shield that includes a metal to a portion of the first side of the substrate, wherein at least a portion of the metal routing is between the shield and the second side of the substrate, wherein the shield and the metal routing are electrically isolated from each other, wherein the shield reduces electromagnetic interference (EMI) or radio frequency interference (RFI) transmitted or received by the metal routing, and wherein the shield reduces warpage in the substrate.

Example 24 includes the method of example 23, or of any other example or embodiment herein, further comprising coupling a package to the first side of the substrate, wherein the package is electrically coupled with the metal routing.

Example 25 includes the method of example 23, or of any other example or embodiment herein, wherein applying a shield further includes securing the shield to the first side of the substrate using an adhesive.

Example 26 includes an apparatus, comprising: a substrate with a first side and a second side opposite the first side; an electrically conductive trace proximate to the first side of the substrate; a structure over the first side of the substrate, the structure comprising a first portion extending in a first direction and a second portion extending in a second direction different than the first direction; wherein the first portion is at least partially over the trace; and wherein the structure is electrically coupled to a ground terminal.

Example 27 includes the apparatus of example 26, or of any other example or embodiment herein, wherein the structure is secured to the first side of the substrate, and wherein the structure reduces warpage of the substrate.

Example 28 includes the apparatus of example 26, or of any other example or embodiment herein, wherein the structure further includes a third portion extending in a third direction different than the first direction or the second direction.

Example 29 includes the apparatus of example 26, or of any other example or embodiment herein, wherein a material of the structure includes a selected one or more of: steel, copper, aluminum, ceramic, or plastic.

Example 30 includes the apparatus of example 26, or of any other example or embodiment herein, wherein the electrically conductive trace is a part of a microstrip transmission line.

Example 31 includes the apparatus of example 26, or of any other example or embodiment herein, wherein the electrically conductive trace is at a top layer of the substrate.

Example 32 includes the apparatus of example 26, or of any other example or embodiment herein, wherein a material of the structure includes a ceramic.

Example 33 includes the apparatus of example 26, or of any other example or embodiment herein, wherein the structure and the electrically conductive trace are electrically isolated from each other.

Example 34 includes the apparatus of example 26, or of any other example or embodiment herein, wherein the electrically conductive trace includes a plurality of electrically conductive traces.

Example 35 includes the apparatus of example 26, or of any other example or embodiment herein, further comprising: one or more electrically conductive vias electrically coupled with the electrically conductive trace, wherein the one or more electrically conductive vias extend from the electrically conductive trace toward the second side of the substrate; and wherein the one or more electrically conductive vias are between a portion of the structure and the second side of the substrate.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. An apparatus, comprising:
a substrate with a first side and a second side opposite the first side;
an electrically conductive trace proximate to the first side of the substrate;
a structure over the first side of the substrate, the structure comprising a first portion extending in a first direction and a second portion extending in a second direction different than the first direction;
wherein the first portion is at least partially over the electrically conductive trace; and
wherein the structure is electrically coupled to a ground terminal, the ground terminal beneath the electrically conductive trace, wherein the electrically conductive trace is vertically overlapping with the ground terminal along a vertical axis, and wherein the first portion of the structure is vertically overlapping with the electrically conductive trace and with the ground terminal along the vertical axis.

2. The apparatus of claim 1, wherein the structure is secured to the first side of the substrate, and wherein the structure reduces warpage of the substrate.

3. The apparatus of claim 1, wherein the structure further includes a third portion extending in a third direction different than the first direction or the second direction.

4. The apparatus of claim 1, wherein a material of the structure includes a selected one or more of: steel, copper, aluminum, ceramic, or plastic.

5. The apparatus of claim 1, wherein the electrically conductive trace is a part of a microstrip transmission line.

6. The apparatus of claim 1, wherein the electrically conductive trace is at a top layer of the substrate.

7. The apparatus of claim 1, wherein a material of the structure includes a ceramic.

8. The apparatus of claim 1, wherein the structure and the electrically conductive trace are electrically isolated from each other.

9. The apparatus of claim 1, wherein the electrically conductive trace includes a plurality of electrically conductive traces.

10. The apparatus of claim 1, further comprising:
one or more electrically conductive vias electrically coupled with the electrically conductive trace, wherein the one or more electrically conductive vias extend from the electrically conductive trace toward the second side of the substrate; and
wherein the one or more electrically conductive vias are between a portion of the structure and the second side of the substrate.

11. A package comprising:
a substrate with a first side and a second side opposite the first side;
a first die on the first side of the substrate and a second die on the second side of the substrate;

an electrically conductive routing proximate to the first side of the substrate, wherein the electrically conductive routing electrically couples the first die with the second die; and a layer on the first side of the substrate, wherein a portion of the layer is between the first die and the second die, wherein a portion of the electrically conductive routing is between the portion of the layer and the second side of the substrate, wherein the layer is coupled to a ground terminal, the ground terminal beneath the portion of the electrically conductive routing, wherein the portion of the electrically conductive routing is vertically overlapping with the ground terminal along a vertical axis, and wherein the portion of the layer is vertically overlapping with the portion of the electrically conductive routing and with the ground terminal along the vertical axis.

12. The package of claim 11, wherein the electrically conductive routing is a first electrically conductive routing, and wherein the portion of the layer is a first portion of the layer; and further comprising:

a third die on the first side of the substrate;

a second electrically conductive routing proximate to the first side of the substrate, the second electrically conductive routing electrically coupling the first die with the third die; and wherein a second portion of the layer is between the first die and the third die, and wherein a portion of the second electrically conductive routing is between the second portion of the layer and the second side of the substrate.

13. The package of claim 12, wherein the first electrically conductive routing includes a plurality of first electrically conductive routings; and wherein the second electrically conductive routing includes a plurality of second electrically conductive routings.

14. The package of claim 12, wherein the first electrically conductive routing and the second electrically conductive routing are at a top layer of the substrate.

15. The package of claim 11, wherein the electrical routing includes a microstrip transmission line.

16. The package of claim 11, wherein the layer includes a metal.

17. The package of claim 16, wherein the layer is electrically conductive.

18. The package of claim 11, wherein the layer is secured to the first side of the substrate with an adhesive.

19. The package of claim 11, wherein the substrate is a coreless substrate.

20. The package of claim 11, wherein the substrate has a core with a thickness that is less than 200 µm.

21. The package of claim 11, wherein the electrical routing is a plurality of electrical routings.

22. A method comprising:

providing a substrate having a first side and a second side opposite the first side, the substrate including a metal routing proximate to the first side of the substrate; and applying a shield that includes a metal to a portion of the first side of the substrate, wherein at least a portion of the metal routing is between the shield and the second side of the substrate, wherein the shield and the metal routing are electrically isolated from each other, wherein the shield is coupled to a ground terminal, the ground terminal beneath the portion of the metal routing, wherein the portion of the metal routing is vertically overlapping with the ground terminal along a vertical axis, and wherein the shield is vertically overlapping with the portion of the metal routing and with the ground terminal along the vertical axis.

23. The method of claim 22, further comprising coupling a package to the first side of the substrate, wherein the package is electrically coupled with the metal routing.

24. The method of claim 22, wherein applying a shield further includes securing the shield to the first side of the substrate using an adhesive.

*   *   *   *   *